US010777427B2

(12) United States Patent
Furukawa

(10) Patent No.: US 10,777,427 B2
(45) Date of Patent: Sep. 15, 2020

(54) LIGHT IRRADIATION TYPE HEAT TREATMENT METHOD

(71) Applicant: SCREEN HOLDINGS CO., LTD., Kyoto (JP)

(72) Inventor: Masashi Furukawa, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 98 days.

(21) Appl. No.: 16/212,365

(22) Filed: Dec. 6, 2018

(65) Prior Publication Data

US 2019/0252205 A1 Aug. 15, 2019

(30) Foreign Application Priority Data

Feb. 13, 2018 (JP) .................................. 2018-022883

(51) Int. Cl.
| | | |
|---|---|---|
| *H01L 21/324* | (2006.01) | |
| *H01L 21/67* | (2006.01) | |
| *H01L 21/687* | (2006.01) | |

(52) U.S. Cl.
CPC ...... *H01L 21/324* (2013.01); *H01L 21/67115* (2013.01); *H01L 21/6875* (2013.01); *H01L 21/68707* (2013.01); *H01L 21/68757* (2013.01)

(58) Field of Classification Search
CPC .......... H01L 21/68707; H01L 21/6875; H01L 21/67115; H01L 21/68757;
(Continued)

(56) References Cited

U.S. PATENT DOCUMENTS

| | | | | |
|---|---|---|---|---|
| 7,859,088 | B2 * | 12/2010 | Sukegawa | ......... H01L 21/31111 |
| | | | | 257/649 |
| 8,173,937 | B2 * | 5/2012 | Yokouchi | .............. F27D 5/0037 |
| | | | | 219/411 |

(Continued)

FOREIGN PATENT DOCUMENTS

| | | |
|---|---|---|
| JP | 2009-164451 A | 7/2009 |
| KR | 2006-0114042 A | 11/2006 |
| KR | 10-1589599 B1 | 1/2016 |

OTHER PUBLICATIONS

Taiwanese Office Action issued in corresponding Taiwanese Patent Application No. 107138915, dated Oct. 28, 2019, with English translation of the Japanese translation of the Taiwanese Office Action.

(Continued)

*Primary Examiner* — Bac H Au
(74) *Attorney, Agent, or Firm* — McDermott Will & Emery LLP

(57) ABSTRACT

The temperature of a susceptor made of quartz is increased by heat transfer and heat radiation from a heated semiconductor wafer. When the treated semiconductor wafer is transported outwardly, the susceptor has a non-uniform temperature distribution in which a central portion thereof is higher in temperature than an edge portion thereof. In an early stage of preheating in which a new semiconductor wafer is held by the susceptor and starts being irradiated with light emanating from halogen lamps, an intensity ratio that is the ratio of the intensity of light emanating from a central portion of a light irradiator including an array of the halogen lamps to the intensity of light emanating from an edge portion thereof is less than 100%. Thereafter, the ratio of the intensity of light emanating from the central portion of the light irradiator to the intensity of light emanating from the edge portion thereof is increased.

6 Claims, 7 Drawing Sheets

(58) Field of Classification Search
CPC ......... H01L 21/67248; H01L 21/68742; H01L 21/26; H01L 21/324–3247; H01L 21/0231; H05B 3/0047; H05B 1/0233
See application file for complete search history.

(56) References Cited

U.S. PATENT DOCUMENTS

| | | | | |
|---|---|---|---|---|
| 9,082,728 | B2* | 7/2015 | Yokouchi | H01L 21/324 |
| 9,922,889 | B2* | 3/2018 | Ono | C23C 14/02 |
| 10,121,664 | B2* | 11/2018 | Fuse | H01L 21/02129 |
| 10,446,397 | B2* | 10/2019 | Aoyama | H01L 21/2686 |
| 10,573,569 | B2* | 2/2020 | Furukawa | H01L 22/20 |
| 10,636,676 | B2* | 4/2020 | Ono | H01L 21/324 |
| 10,643,850 | B2* | 5/2020 | Tanimura | H01L 21/67115 |
| 2003/0109071 | A1 | 6/2003 | Wang et al. | |
| 2004/0018702 | A1 | 1/2004 | Ito et al. | |
| 2007/0071906 | A1* | 3/2007 | Seki | H01L 21/67115 427/523 |
| 2008/0214020 | A1* | 9/2008 | Ito | H01L 21/324 438/795 |
| 2009/0175605 | A1 | 7/2009 | Kobayashi | |
| 2014/0206108 | A1* | 7/2014 | Kiyama | H01L 21/67248 438/5 |
| 2016/0336195 | A1 | 11/2016 | Fuse | |

OTHER PUBLICATIONS

Korean Notification of Reasons for Refusal issued in corresponding Korean Patent Application No. 10-2018-0168224, dated Mar. 6, 2020, with English translation.
Taiwanese Office Action issued in corresponding Taiwanese Patent Application No. 107138915, dated Jun. 29, 2020, with partial English translation of the Japanese translation of the Taiwanese Office Action.

* cited by examiner

LIGHT IRRADIATION TYPE HEAT TREATMENT METHOD

BACKGROUND OF THE INVENTION

Field of the Invention

The present invention relates to a heat treatment method which irradiates a thin plate-like precision electronic substrate (hereinafter referred to simply as a "substrate") such as a semiconductor wafer held by a susceptor made of quartz with light emanating from a plurality of continuous lighting lamps to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature in an extremely short time, thereby achieving only the activation of the impurities without deep diffusion of the impurities.

U.S. Patent Application Publication No. 2009/0175605 discloses an apparatus which holds a semiconductor wafer on a susceptor made of quartz, irradiates the semiconductor wafer with light from halogen lamps to preheat the semiconductor wafer, and thereafter irradiates the semiconductor wafer with a flash of light from flash lamps to perform flash lamp annealing. In the flash lamp annealing apparatus disclosed in U.S. Patent Application Publication No. 2009/0175605, the halogen lamps are disposed under the susceptor, and light emitted from the halogen lamps is transmitted through the susceptor made of quartz to impinge upon the lower surface of the semiconductor wafer.

When heating treatment is performed on the semiconductor wafer held on the susceptor as disclosed in U.S. Patent Application Publication No. 2009/0175605, the susceptor is also heated by heat transfer and heat radiation from the semiconductor wafer that is at an increased temperature. Part of the light emitted from the halogen lamps is also absorbed by the susceptor made of quartz to thereby heat the susceptor. As a result, the temperature of the susceptor is increased to a certain degree.

A series of processes in the flash lamp annealing apparatus necessarily include the step of decreasing the temperature of the semiconductor wafer after the flash irradiation. During the decrease in temperature of the semiconductor wafer, the temperature of the susceptor which holds the semiconductor wafer thereon also decreases. The temperatures of both the semiconductor wafer and the susceptor start decreasing in edge portions thereof, and decrease latest in central portions thereof. Thus, when the semiconductor wafer subjected to the heating treatment is transported out of the apparatus, the susceptor has a non-uniform temperature distribution in which the central portion thereof is at a high temperature whereas the edge portion thereof is at a relatively low temperature. In particular, if the time required for the decrease in temperature is shortened for improvement in throughput of the apparatus, significant non-uniformity of the temperature distribution exists in the susceptor at the time of the transport of the semiconductor wafer out of the apparatus.

If a new semiconductor wafer that is at room temperature is held on the susceptor having such a non-uniform temperature distribution, the semiconductor wafer is heated non-uniformly by heat radiation from the susceptor. That is, the central portion of the semiconductor wafer is heated more strongly than the edge portion thereof, so that the semiconductor wafer also has a non-uniform temperature distribution in which the temperature of the central portion thereof is higher than that of the edge portion thereof. It has turned out that warpage occurs in the semiconductor wafer if irradiation with light from the halogen lamps is started in this state to heat the semiconductor wafer.

SUMMARY

The present invention is intended for a method of heating a substrate held by a susceptor made of quartz by irradiating the substrate with light emanating from a plurality of continuous lighting lamps.

According to one aspect of the present invention, the method comprises the steps of: (a) irradiating the substrate with light with an intensity ratio defined as a first ratio of less than 100% at the start of irradiation with light emanating from the plurality of continuous lighting lamps, the intensity ratio being the ratio of the intensity of light emanating from a central portion of a light irradiator including an array of the continuous lighting lamps to the intensity of light emanating from an edge portion of the light irradiator; and (b) irradiating the substrate with light with the intensity ratio defined as a second ratio higher than the first ratio, the step (b) being performed after the step (a).

The method is capable of heating the substrate without causing warpage in the substrate.

Preferably, the method further comprises the step of (c) irradiating the substrate with light with the intensity ratio defined as a third ratio of less than 100%, the step (c) being performed after the step (b).

The method is capable of heating the substrate uniformly.

It is therefore an object of the present invention to heat a substrate without causing warpage in the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described in detail with reference to the drawings.

Figure 1:
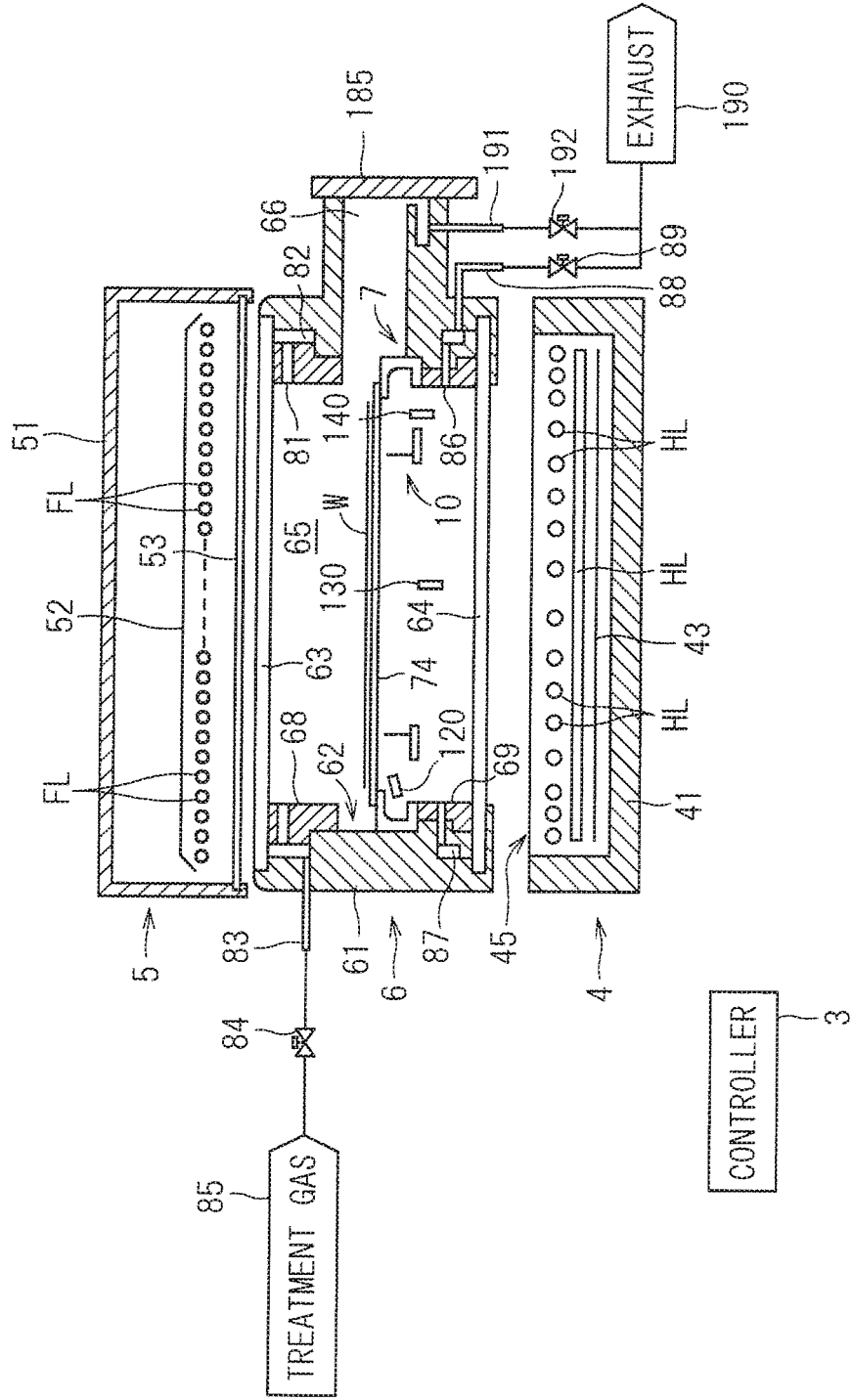
FIG. 1 is a longitudinal sectional view showing a configuration of a heat treatment apparatus for use in a heat treatment method according to the present invention.

First, a heat treatment apparatus for carrying out a heat treatment method according to the present invention will be described. FIG. 1 is a longitudinal sectional view showing a configuration of a heat treatment apparatus 1 for use in the heat treatment method according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
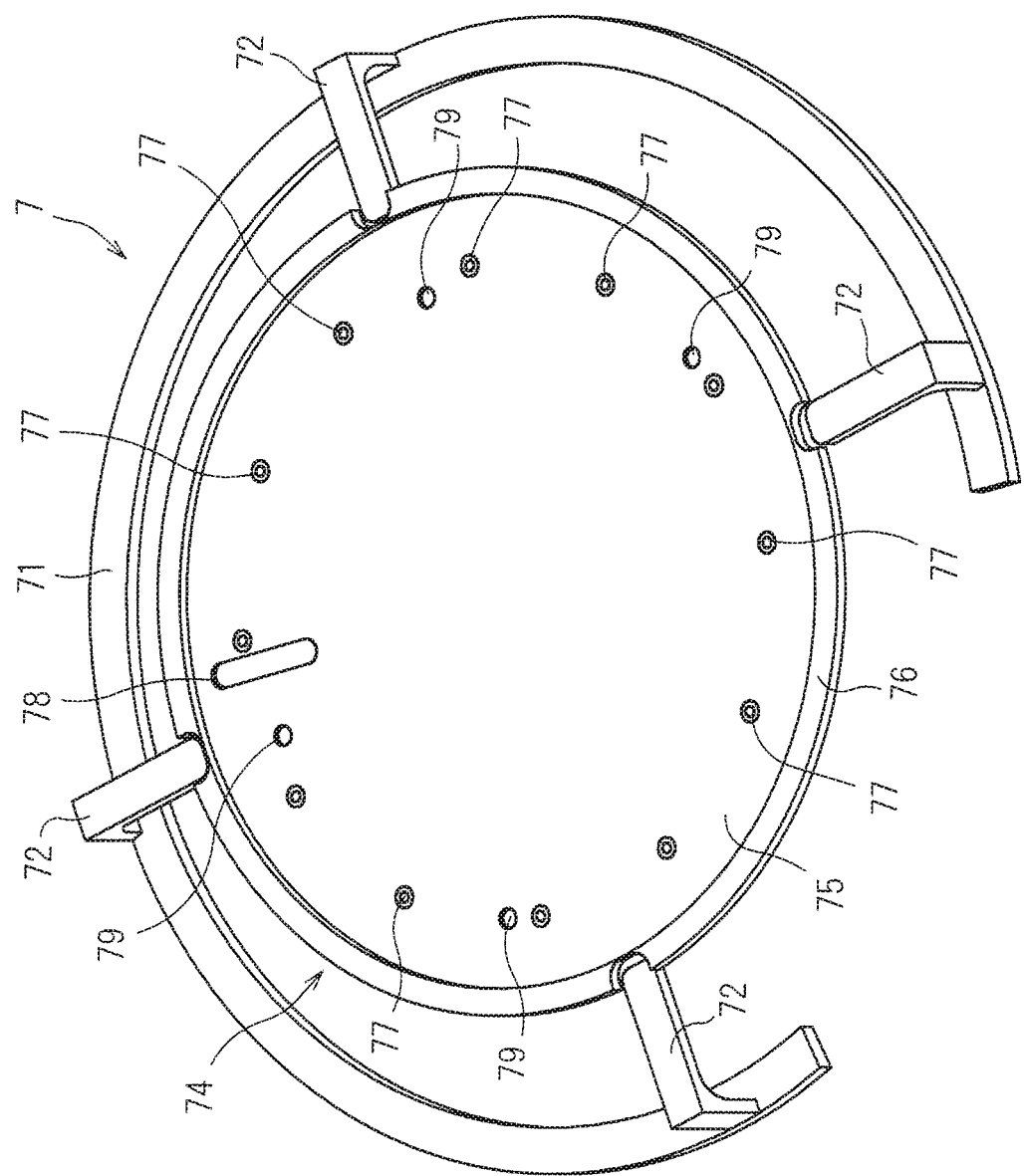
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
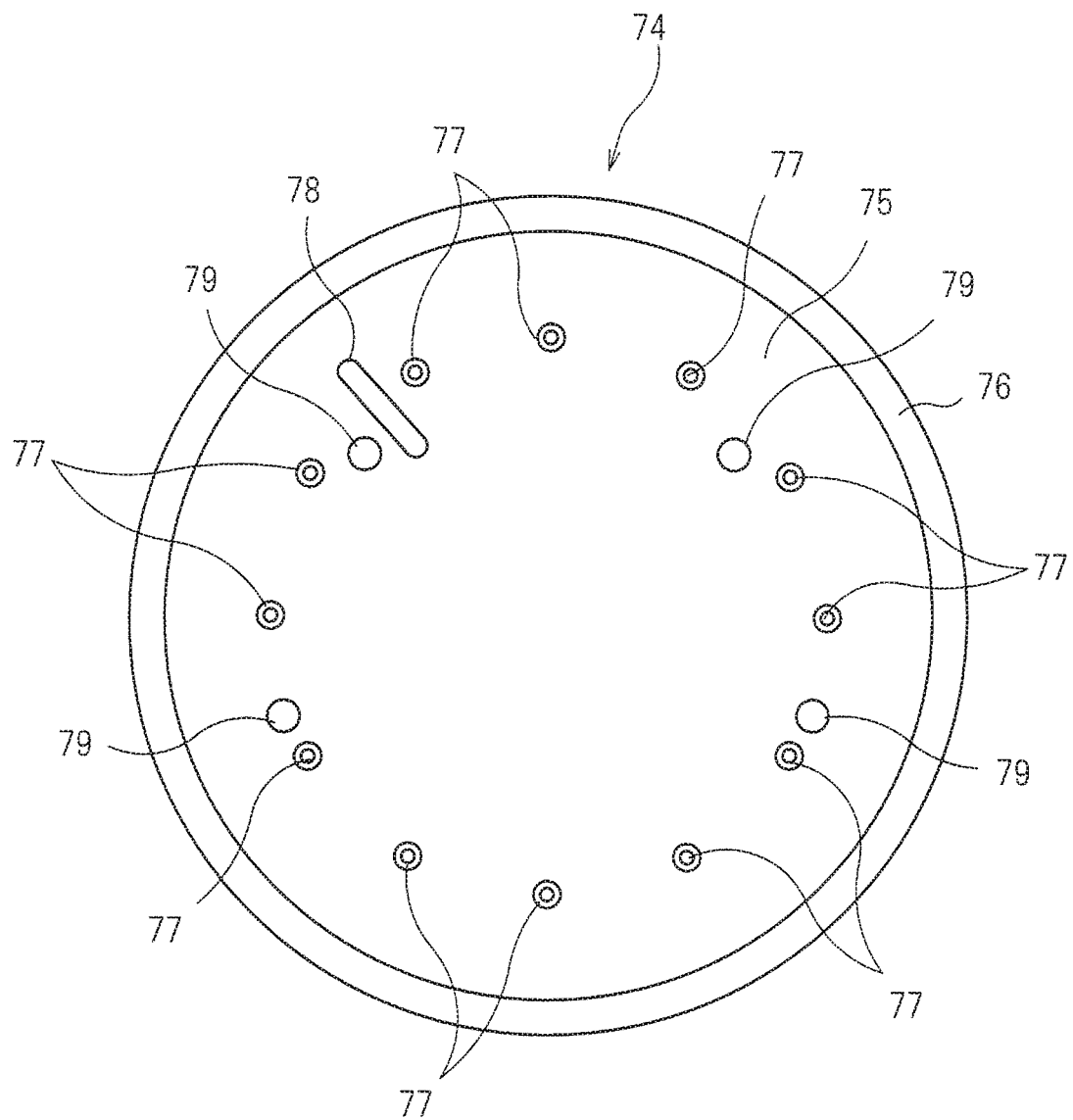
FIG. 3 is a plan view of a susceptor.
Figure 4:
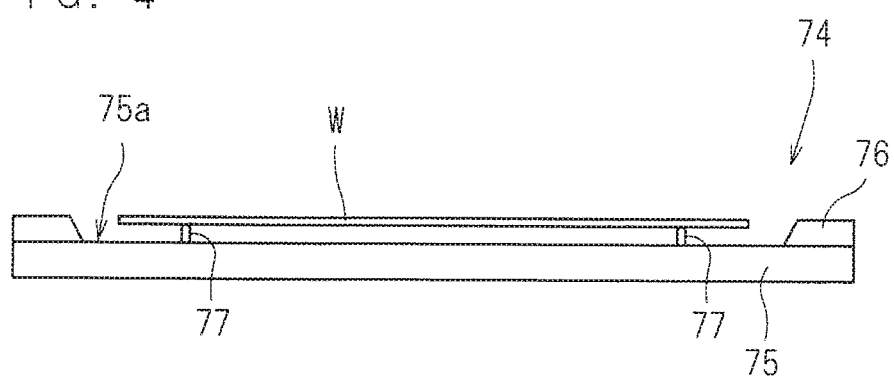
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from the lower surface of the semiconductor wafer W. Specifically, the radiation thermometer 120 receives the radiation emitted from the lower surface of the semiconductor wafer W through the opening 78 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
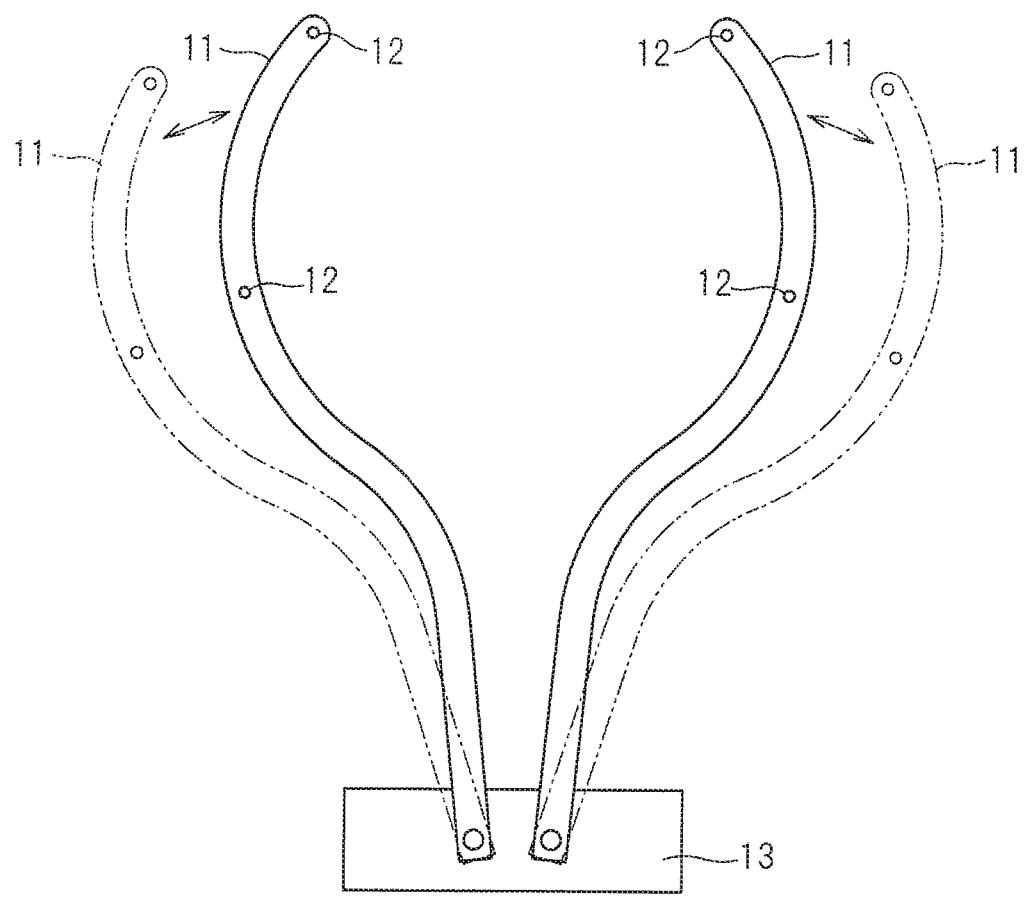
FIG. 5 is a plan view of a transfer mechanism.
Figure 6:
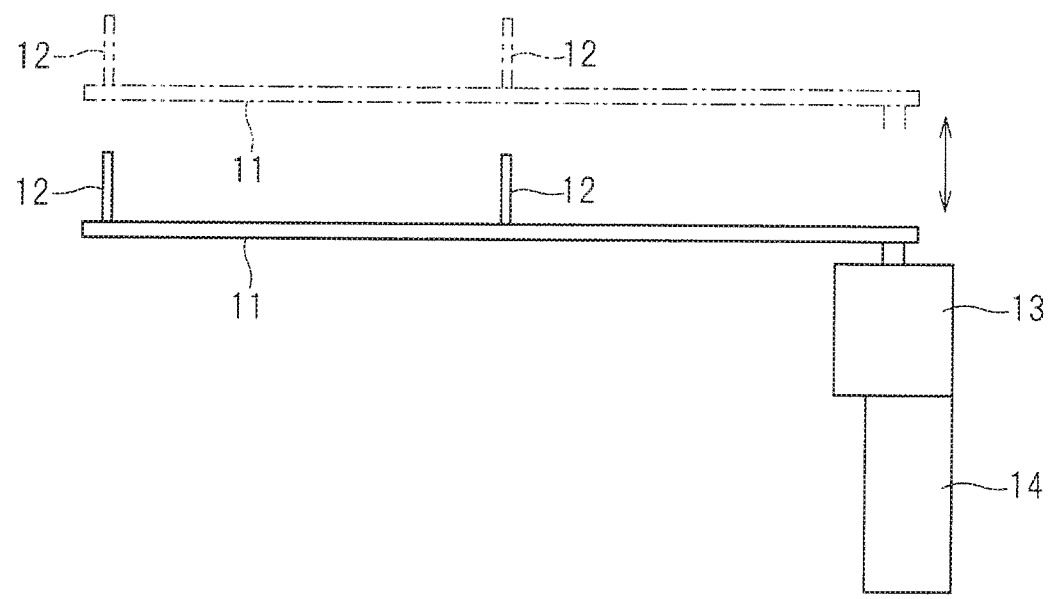
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

As shown in FIG. 1, the heat treatment apparatus 1 is provided with three radiation thermometers 120, 130 and 140. As mentioned above, the radiation thermometer 120 measures the temperature of the semiconductor wafer W through the opening 78 provided in the susceptor 74. The radiation thermometer 130 senses infrared radiation emanating from a central portion of the susceptor 74 to measure the temperature of the central portion. The radiation thermometer 140, on the other hand, senses infrared radiation emanating from an edge portion of the susceptor 74 to measure the temperature of the edge portion.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes a light irradiator 45 including an array of the multiple (in the present preferred embodiment, 40) halogen lamps HL in an enclosure 41. The halogen heating part 4 directs light from under the chamber 6 through the lower chamber window 64 toward the heat treatment space 65 to heat the semiconductor wafer W by means of the halogen lamps HL.

Figure 7:
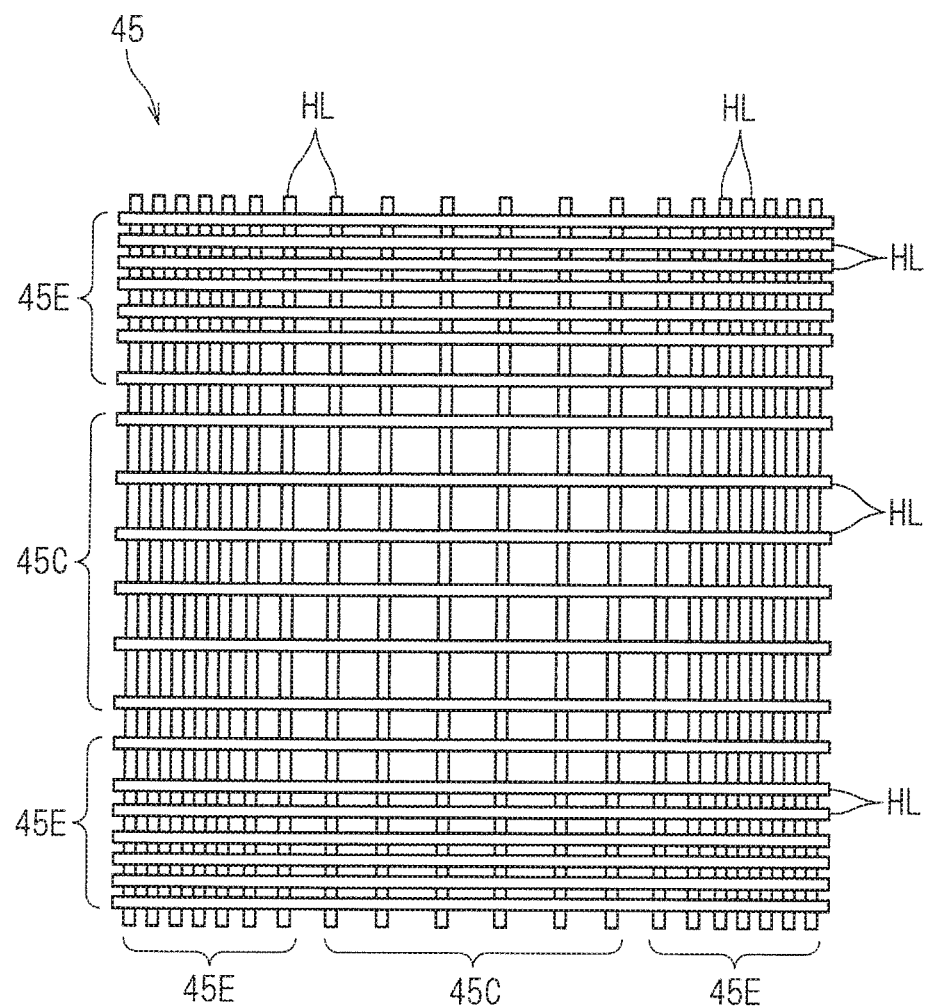
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

The intensity of light emanating from each of the 40 halogen lamps HL in the halogen heating part 4 is individually adjustable by individually controlling an output from each of the halogen lamps HL. In the present preferred embodiment, the 40 halogen lamps HL are divided into several lamp groups, and the intensity of emanating light is adjusted for each of the lamp groups. Specifically, of the 20 halogen lamps HL in the upper tier, seven from each of the opposite ends of the arrangement of the 20 halogen lamps HL are defined to belong to an edge lamp group 45E, and six in the middle thereof are defined to belong to a central lamp group 45C, as shown in FIG. 7. Similarly, of the 20 halogen lamps HL in the lower tier, seven from each of the opposite ends of the arrangement of the 20 halogen lamps HL are defined to belong to the edge lamp group 45E, and six in the middle thereof are defined to belong to the central lamp group 45C. The intensity of light emanating from each of the edge lamp group 45E and the central lamp group 45C is individually adjusted. In other words, the intensity of light emanating from the edge portion of the light irradiator 45 including the array of the 40 halogen lamps HL and the intensity of light emanating from the central portion thereof are individually adjusted.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed. The controller 3 also individually controls the intensity of light emanating from each of the edge lamp group 45E and the central lamp group 45C.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a treatment operation in the heat treatment apparatus 1 will be described. First, a typical procedure for the heat treatment of a semiconductor wafer W to be treated will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by means of flash irradiation. The procedure for the treatment of the semiconductor wafer W which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6. At this time, there is a danger that an atmosphere outside the heat treatment apparatus 1 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 120 when the halogen lamps HL perform the preheating. Specifically, the radiation thermometer 120 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 120. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat. The details on the control of the output from the halogen lamps HL during the preheating will be described later in further detail.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 120 reaches the preheating temperature T1, the controller 3 adjusts the output from the halogen lamps HL to maintain the temperature of the semiconductor wafer W at approximately the preheating temperature T1.

The flash lamps FL in the flash heating part 5 irradiate the front surface of the semiconductor wafer W held by the susceptor 74 with a flash of light at the point in time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The radiation thermometer 120 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

As mentioned above, the semiconductor wafer W to be treated is preheated to the preheating temperature T1 by irradiation with light from the halogen lamps HL, and is thereafter flash heated to the treatment temperature T2. The susceptor 74 which holds the semiconductor wafer W is also heated by heat transfer and heat radiation from the semiconductor wafer W that is at an increased temperature, so that the temperature of the susceptor 74 is increased.

When the temperature of the semiconductor wafer W decreases after the turning off of the halogen lamps HL, the temperature of the susceptor 74 also decreases. At this time, the temperatures of both the semiconductor wafer W and the susceptor 74 start decreasing in edge portions thereof which dissipate more heat, and decrease latest in central portions thereof. That is, a temperature gradient such that the temperature decreases from the central portions to the edge portions occurs in the semiconductor wafer W and the susceptor 74. It should be noted that the edge portion of the susceptor 74 refers to an edge portion in a region thereof opposed to the semiconductor wafer W when the semiconductor wafer W is held by the susceptor 74.

From the viewpoint of shortening the treatment time to improve throughput, it is contemplated to shorten waiting time required for the temperature of the semiconductor wafer W in the chamber 6 to decrease after the turning off of the halogen lamps HL. In this case, the semiconductor wafer W is transported out of the chamber 6, with the temperature of the semiconductor wafer W not sufficiently decreased but maintained somewhat high, and the temperature of the susceptor 74 is also not sufficiently decreased. When the semiconductor wafer W is transported out of the chamber 6, the susceptor 74 has a non-uniform temperature distribution in which the central portion thereof is at a relatively high temperature whereas the edge portion thereof is at a relatively low temperature.

If a new semiconductor wafer W that is at room temperature is held by the susceptor 74 having such a non-uniform temperature distribution, the central portion of the semiconductor wafer W is strongly heated by heat radiation from the central portion of the susceptor 74 that is at a relatively high temperature whereas the edge portion of the semiconductor wafer W is not strongly heated. When the semiconductor wafer W in this state is irradiated with light at a uniform intensity from the 40 halogen lamps HL in the halogen heating part 4, the central portion of the semiconductor wafer W is heated too strongly, so that warpage occurs in the semiconductor wafer W in the preheating stage.

Figure 8:
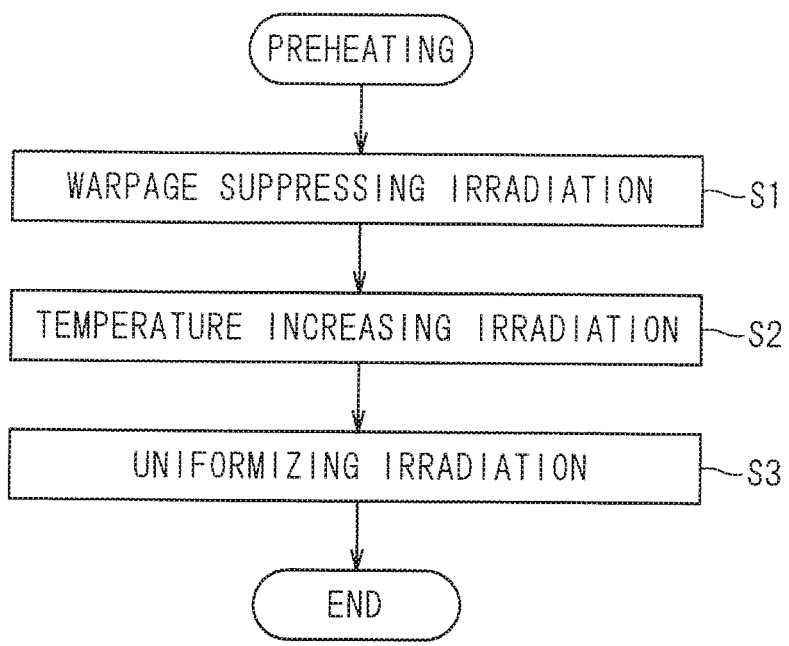
FIG. 8 is a flow diagram showing a procedure for irradiation with light from the halogen lamps during preheating.
Figure 9:
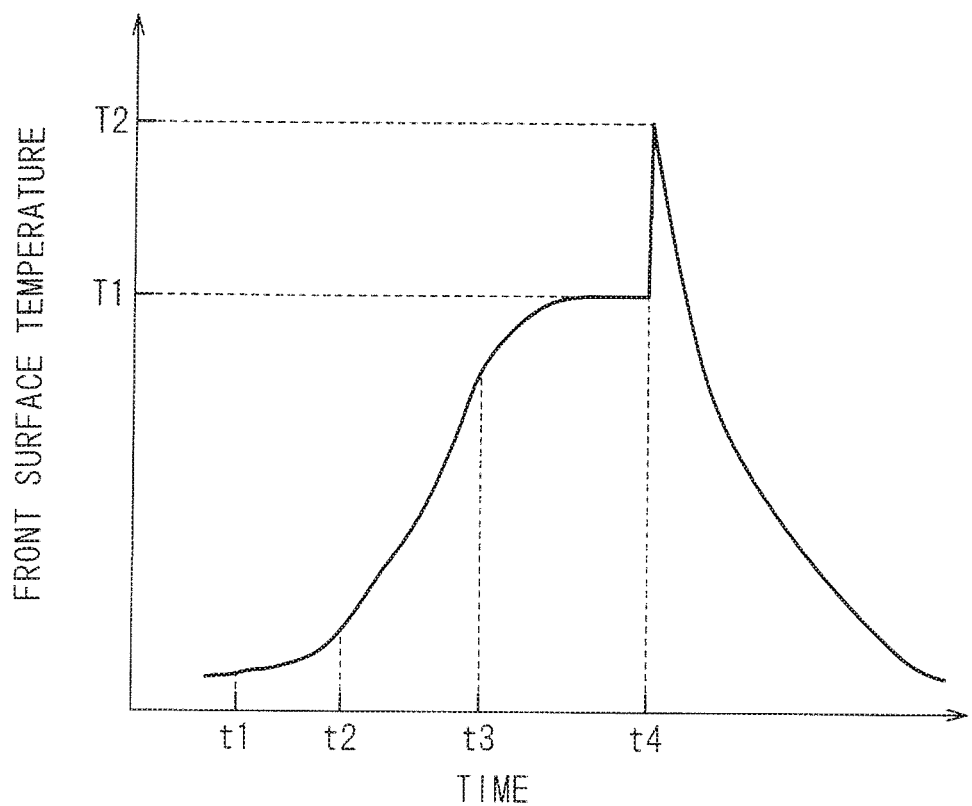
FIG. 9 is a graph showing changes in front surface temperature of a semiconductor wafer.

To prevent this, the output from the halogen lamps HL in the preheating stage is controlled in a manner to be described below in the present preferred embodiment. FIG. 8 is a flow diagram showing a procedure for irradiation with light from the halogen lamps HL during the preheating. FIG. 9 is a graph showing changes in front surface temperature of the semiconductor wafer W.

After the semiconductor wafer W transported into the chamber 6 is held by the susceptor 74, the 40 halogen lamps HL turn on at time t1 to start the preheating. In an early stage of the preheating from the time t1 to time t2, "warpage suppressing irradiation (a first irradiation step)" from the halogen lamps HL is performed (Step S1). In the process of warpage suppressing irradiation, an intensity ratio that is the ratio of the intensity of light emanating from the central portion of the light irradiator 45 including the array of the 40 halogen lamps HL to the intensity of light emanating from the edge portion thereof is less than 100%. That is, the intensity of light emanating from the central portion of the light irradiator 45 is lower than the intensity of light emanating from the edge portion thereof. Specifically, the ratio of the intensity of light emanating from the central lamp group 45C to the intensity of light emanating from the edge lamp group 45E is in the range of 40% to 70%. The time period from the time t1 to the time t2 during which the warpage suppressing irradiation from the halogen lamps HL is performed is in the range of 5 to 15 seconds.

Figure 10:
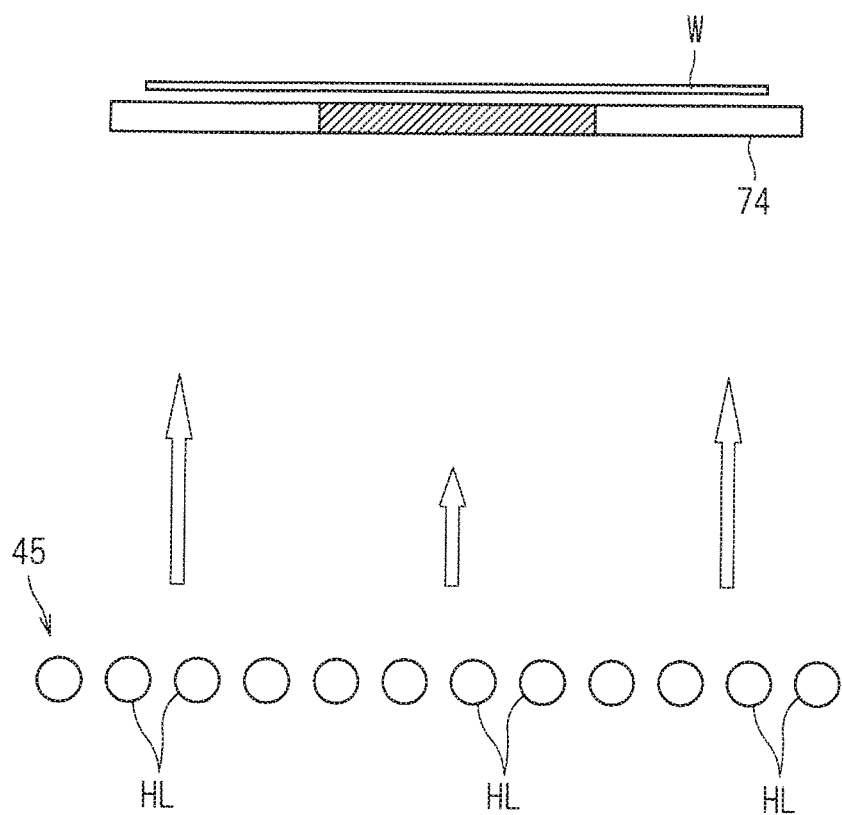
FIG. 10 is a schematic view during the execution of warpage suppressing irradiation.

FIG. 10 is a schematic view during the execution of the warpage suppressing irradiation. The warpage suppressing irradiation from the light irradiator 45 including the array of the halogen lamps HL is performed on the semiconductor wafer W held by the susceptor 74 having a non-uniform temperature distribution in which the central portion thereof is at a relatively higher temperature than the edge portion thereof. Although the central portion of the semiconductor wafer W is more strongly heated from the susceptor 74 having the non-uniform temperature distribution than the edge portion thereof, the intensity of light emanating from the central portion of the light irradiator 45 is lower than the intensity of light emanating from the edge portion thereof in the early stage of the preheating, whereby the entire surface of the semiconductor wafer W is substantially uniformly heated. As a result, the semiconductor wafer W is preheated without warpage in the semiconductor wafer W.

To heat the entire surface of the semiconductor wafer W substantially uniformly by canceling the non-uniform heating from the susceptor 74, it is preferable that the ratio of the intensity of light emanating from the central portion of the light irradiator 45 to the intensity of light emanating from the edge portion thereof is not more than 70%. On the other hand, if the intensity of light emanating from the central portion of the light irradiator 45 is extremely lower than the intensity of light emanating from the edge portion thereof, the edge portion of the semiconductor wafer W is heated too strongly on the contrary, so that warpage occurs in the semiconductor wafer W. It is hence necessary that the ratio of the intensity of light emanating from the central portion of the light irradiator 45 to the intensity of light emanating from the edge portion thereof is not less than 40%.

It is preferable to perform the warpage suppressing irradiation in the case where the temperature of the central portion of the susceptor 74 is 250° C. or above and where a difference in temperature between the central portion of the susceptor 74 and the edge portion thereof is 20° C. or above when the semiconductor wafer W is held by the susceptor 74. That is, it is preferable to perform the aforementioned warpage suppressing irradiation in the case where the susceptor 74 has a non-uniform temperature distribution in which the central portion thereof is at a relatively high temperature and the edge portion thereof is at a temperature lower than that of the central portion. The reason is as follows. If the temperature of the central portion of the susceptor 74 is not so high and the central and edge portions of the susceptor 74 do not have the non-uniform temperature distribution, the warpage suppressing irradiation is not necessary because the central portion of the semiconductor wafer W is not so strongly heated from the susceptor 74. Rather, there is a danger that the execution of the warpage suppressing irradiation heats the edge portion of the semiconductor wafer W too strongly to cause warpage in the semiconductor wafer W. In the case where the temperature of the central portion of the susceptor 74 is 250° C. or above after the halogen lamps HL turn off and the semiconductor wafer W subjected to the heating treatment is transported out of the chamber 6, the temperature of the edge portion of the susceptor 74 is often lower by 20° C. or above than that of the central portion thereof.

Next, switching from the "warpage suppressing irradiation" to "temperature increasing irradiation" is done at the time t2. The "temperature increasing irradiation (a second irradiation step)" from the halogen lamps HL is performed from the time t2 to time t3 (Step S2). The temperature increasing irradiation refers to irradiation in a central stage of the preheating which increases the temperature of the semiconductor wafer W to near the preheating temperature T1. In the process of temperature increasing irradiation, the ratio of the intensity of light emanating from the central portion of the light irradiator 45 to the intensity of light emanating from the edge portion thereof is higher than the intensity ratio used in the process of warpage suppressing irradiation. That is, the ratio of the intensity of light emanating from the central portion of the light irradiator 45 to the intensity of light emanating from the edge portion thereof is at least more than 70%. The ratio of the intensity of light emanating from the central portion of the light irradiator 45 to the intensity of light emanating from the edge portion thereof in the process of temperature increasing irradiation may be either not more than 100% or more than 100% so long as the ratio is higher than that used in the process of warpage suppressing irradiation. In the present preferred embodiment, the ratio of the intensity of light emanating from the central portion of the light irradiator 45 to the intensity of light emanating from the edge portion thereof in the process of temperature increasing irradiation is more than 100%. Specifically, the ratio of the intensity of light emanating from the central lamp group 45C to the intensity of light emanating from the edge lamp group 45E is more than 100%, so that the intensity ratio used in the process of temperature increasing irradiation is in reverse relation to that used in the process of warpage suppressing irradiation.

By making the ratio of the intensity of light emanating from the central portion of the light irradiator 45 to the intensity of light emanating from the edge portion thereof more than 100%, the central portion of the semiconductor wafer W is heated more strongly in the process of temperature increasing irradiation than in the process of warpage suppressing irradiation. Preventing warpage in the semiconductor wafer W through the use of the warpage suppressing irradiation in the early stage of the preheating precludes subsequent warpage in the semiconductor wafer W even if the central portion of the semiconductor wafer W is thereafter heated strongly by making the intensity of light emanating from the central portion of the light irradiator 45 higher than the intensity of light emanating from the edge portion thereof. The temperature increasing irradiation which heats the central portion of the semiconductor wafer W strongly is advantageous in rapidly increasing the temperature of the semiconductor wafer W to near the preheating temperature T1.

Next, switching from the "temperature increasing irradiation" to "uniformizing irradiation" is done at the time t3. The "uniformizing irradiation (a third irradiation step)" from the halogen lamps HL is performed from the time t3 to the turning off of the halogen lamps HL (Step S3). The uniformizing irradiation refers to finishing irradiation in the preheating for heating the entire semiconductor wafer W uniformly to the preheating temperature T1. In the process of uniformizing irradiation, the ratio of the intensity of light emanating from the central portion of the light irradiator 45 to the intensity of light emanating from the edge portion thereof is less than 100% again. Specifically, the ratio of the intensity of light emanating from the central lamp group 45C to the intensity of light emanating from the edge lamp group 45E is less than 100%.

Typically, although the edge portion of the semiconductor wafer W dissipates more heat than the central portion thereof, the central portion of the semiconductor wafer W is heated more strongly in the process of temperature increasing irradiation described above. As a result, there is a danger that the semiconductor wafer W has a non-uniform in-plane temperature distribution. To avoid this, the process of uniformizing irradiation in which the ratio of the intensity of light emanating from the central portion of the light irradiator 45 to the intensity of light emanating from the edge portion thereof is less than 100% is performed in the final stage of the preheating. The uniformizing irradiation achieves the uniform in-plane temperature distribution of the semiconductor wafer W because the edge portion of the semiconductor wafer W where heat dissipation is liable to occur is heated strongly by making the intensity of light emanating from the edge portion of the light irradiator 45 higher than the intensity of light emanating from the central portion thereof. With the temperature of the semiconductor wafer W increased uniformly to the preheating temperature T1, the front surface of the semiconductor wafer W is irradiated with a flash of light from the flash lamps FL at time t4, whereby the front surface is heated uniformly to the treatment temperature T2.

In the present preferred embodiment, the intensity ratio that is the ratio of the intensity of light emanating from the central portion of the light irradiator 45 to the intensity of light emanating from the edge portion thereof is less than 100% in the early stage of the preheating in which the irradiation with light from the halogen lamps HL is started.

Thereafter, the ratio of the intensity of light emanating from the central portion of the light irradiator 45 to the intensity of light emanating from the edge portion thereof is increased. This achieves the rapid preheating of the semiconductor wafer W without causing warpage in the semiconductor wafer W resulting from the non-uniform temperature distribution occurring in the susceptor 74.

Thereafter, the ratio of the intensity of light emanating from the central portion of the light irradiator 45 to the intensity of light emanating from the edge portion thereof is further changed to less than 100% again. This also achieves the uniform in-plane temperature distribution of the semiconductor wafer W.

While the preferred embodiment according to the present invention has been described hereinabove, various modifications of the present invention in addition to those described above may be made without departing from the scope and spirit of the invention. For example, in the case where the temperature of the central portion of the susceptor 74 is below 250° C. when the semiconductor wafer W is held by the susceptor 74, the warpage suppressing irradiation and the temperature increasing irradiation in the aforementioned preferred embodiment may be alternately repeated during the time interval between the time t1 and the time t2 of FIG. 9. The central portion of the semiconductor wafer W is not strongly heated from the susceptor 74 in the case where the temperature of the central portion of the susceptor 74 is below 250° C. Thus, the alternate repetition of the warpage suppressing irradiation and the temperature increasing irradiation in the early stage of the preheating achieves efficient increase in temperature of the semiconductor wafer W without causing warpage in the semiconductor wafer W.

Also, the radiation thermometer 130 measures the temperature of the central portion of the susceptor 74 whereas the radiation thermometer 140 measures the temperature of the edge portion of the susceptor 74, and the controller 3 may automatically change a preheating mode, based on the measurement results. Specifically, the controller 3 selects the preheating mode of the aforementioned preferred embodiment in the case where the temperature of the central portion of the susceptor 74 is 250° C. or above and where the difference in temperature between the central portion of the susceptor 74 and the edge portion thereof is 20° C. or above when the semiconductor wafer W is held by the susceptor 74. On the other hand, the controller 3 selects the preheating mode in which the warpage suppressing irradiation and the temperature increasing irradiation are alternately repeated in the early stage of the preheating in the case where the temperature of the central portion of the susceptor 74 is below 250° C. or where the difference in temperature between the central portion of the susceptor 74 and the edge portion thereof is below 20° C. when the semiconductor wafer W is held by the susceptor 74.

If the susceptor 74 has a temperature distribution contrary to that of the aforementioned preferred embodiment, i.e. a temperature distribution in which the edge portion of the susceptor 74 is at a relatively high temperature and the central portion thereof is at a low temperature, the intensity of light emanating from the edge portion of the light irradiator 45 may be made lower than the intensity of light emanating from the central portion thereof in the process of warpage suppressing irradiation. That is, the light irradiator 45 may emit light with an intensity distribution contrary to the temperature distribution occurring in the susceptor 74.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating. In this case, the intensity of light emanating from the arc lamps is adjusted in the same manner as in the aforementioned preferred embodiment.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell.

Further, the heat treatment technique according to the present invention is not limited to the flash lamp annealer, but may be applied to apparatuses including heat sources other than flash lamps such as single-wafer type lamp annealers employing halogen lamps or CVD apparatuses. In particular, the technique according to the present invention is advantageously applicable to a backside annealer which performs heat treatment by irradiating the back surface of a semiconductor wafer with light from the halogen lamps disposed under a chamber.

While the invention has been described in detail, the foregoing description is in all aspects illustrative and not restrictive. It is understood that numerous other modifications and variations can be devised without departing from the scope of the invention.

What is claimed is:

1. A method of heating a substrate held by a susceptor made of quartz by irradiating the substrate with light emanating from a plurality of continuous lighting lamps, said method comprising the steps of:
   (a) irradiating said substrate with light with an intensity ratio defined as a first ratio of less than 100% at the start of irradiation with light emanating from said plurality of continuous lighting lamps, the intensity ratio being the ratio of the intensity of light emanating from a central portion of a light irradiator including an array of said continuous lighting lamps to the intensity of light emanating from an edge portion of said light irradiator; and
   (b) irradiating said substrate with light with said intensity ratio defined as a second ratio higher than said first ratio, said step (b) being performed after said step (a).

2. The method according to claim 1, wherein said second ratio is more than 100% in said step (b).

3. The method according to claim 1, wherein said first ratio is in the range of 40% to 70%.

4. The method according to claim 1, wherein said substrate is irradiated with light emanating from said plurality of continuous lighting lamps for a time period in the range of 5 to 15 seconds in said step (a).

5. The method according to claim 1, further comprising the step of
   (c) irradiating said substrate with light with said intensity ratio defined as a third ratio of less than 100%, said step (c) being performed after said step (b).

6. The method according to claim 1, wherein
the temperature of a central portion of said susceptor is 250° C. or above, and a difference in temperature between the central portion of said susceptor and an edge portion thereof is 20° C. or above when said substrate is held by said susceptor.

\* \* \* \* \*